(12) United States Patent
Mayer (10) Patent No.: US 10,272,454 B2
(45) Date of Patent: Apr. 30, 2019

(54) COMPRESSED AIR TREATMENT CHAMBER (71) Applicant: Thomas Mayer, Altheim (DE)

(72) Inventor: Thomas Mayer, Altheim (DE)

( * ) Notice: Subject to any disclaimer, the term of this patent is extended or adjusted under 35 U.S.C. 154(b) by 189 days.

(21) Appl. No.: 15/172,777

(22) Filed: Jun. 3, 2016

(65) Prior Publication Data
US 2016/0310974 A1    Oct. 27, 2016

Related U.S. Application Data (63) Continuation of application No. PCT/EP2014/076360, filed on Dec. 3, 2014.

(30) Foreign Application Priority Data

Dec. 4, 2013 (DE) .................... 10 2013 018 132

(51) Int. Cl.
*B05B 5/03* (2006.01)
*B05B 5/08* (2006.01)
(Continued)

(52) U.S. Cl.
CPC .............. *B05B 5/03* (2013.01); *B05B 5/087* (2013.01); *B05B 5/16* (2013.01); *B05B 7/2491* (2013.01);
(Continued)

(58) Field of Classification Search
CPC combination set(s) only.
See application file for complete search history.

(56) References Cited

U.S. PATENT DOCUMENTS 2,894,175 A * 7/1959 Lamm .................. B05B 5/0533
361/228
3,878,469 A   4/1975 Bolasny
(Continued)

FOREIGN PATENT DOCUMENTS

DE       26 46 798 A1   4/1978
DE   10 2010 007 479 B3   6/2011
(Continued)

OTHER PUBLICATIONS

German Search Report (Application No. 10 2013 018 132.1) dated Aug. 26, 2014.
(Continued)

*Primary Examiner* — Duane Smith
*Assistant Examiner* — Sonji Turner
(74) *Attorney, Agent, or Firm* — Burr & Brown, PLLC (57) ABSTRACT

A compressed air treatment chamber for improving the flow properties of compressed air or compressed gas mixtures in a coating process, comprising a housing for forming a hollow space, at least one air inlet opening and at least one air outlet opening are arranged in such a way that the compressed air or the compressed gas mixture can flow through the hollow space, preferably in a longitudinal direction, at least one electrode arranged within the hollow space, at least one high-voltage source for supplying high voltage to the electrode, wherein at least one insulation layer is arranged within the hollow space on an inner surface of an outer casing of the housing, and an electromagnetic field, with an active zone through which compressed air which is to be treated can flow, can be produced in the interior of the hollow space between the electrode and a counterelectrode.

18 Claims, 8 Drawing Sheets

(51) Int. Cl.
*B05B 7/14* (2006.01)
*B05B 5/16* (2006.01)
*B05B 7/24* (2006.01)
*H05H 1/48* (2006.01)
*B05B 7/22* (2006.01)

(52) U.S. Cl.
CPC ............... *H05H 1/48* (2013.01); *B05B 7/22* (2013.01); *H05H 2001/483* (2013.01)

(56) References Cited

U.S. PATENT DOCUMENTS

| | | | | |
|---|---|---|---|---|
| 3,895,262 | A * | 7/1975 | Ribnitz | B05B 5/10 361/227 |
| 4,659,012 | A * | 4/1987 | Coffee | B05B 5/0255 239/3 |
| 5,907,469 | A * | 5/1999 | Kim | B05B 5/032 361/225 |
| 8,096,264 | B2 * | 1/2012 | Seitz | B05B 5/0533 118/625 |
| 2003/0146310 | A1 | 8/2003 | Jackson | |
| 2006/0283387 | A1 | 12/2006 | Takeda | |
| 2012/0024705 | A1 | 2/2012 | Chong | |
| 2012/0304925 | A1 | 12/2012 | Link et al. | |
| 2014/0130723 | A1 * | 5/2014 | Conrads | F23K 3/02 110/347 |

FOREIGN PATENT DOCUMENTS

| | | |
|---|---|---|
| DE | 10 2011 011 054 A1 | 8/2012 |
| DE | 10 2012 014 260 A1 | 1/2013 |
| GB | 1188682 | 4/1970 |
| JP | 2000-042452 A | 2/2000 |
| WO | 2011/161297 A1 | 12/2011 |

OTHER PUBLICATIONS

International Search Report and Written Opinion (Application No. PCT/EP2014/076360) dated Feb. 23, 2015.
International Preliminary Report on Patentability (PCT/EP2014/076360) dated Jun. 16, 2016.

* cited by examiner

COMPRESSED AIR TREATMENT CHAMBER

CROSS REFERENCE TO RELATED APPLICATIONS

This application is a continuation of International Application No. PCT/EP2014/076360 filed Dec. 3, 2014, which designated the United States, and claims the benefit under 35 USC § 119(a)-(d) of German Application No. 10 2013 018 132.1 filed Dec. 4, 2013, the entireties of which are incorporated herein by reference.

FIELD OF THE INVENTION

The present invention relates to a compressed-air treatment chamber and a method for the treatment of compressed air.

BACKGROUND OF THE INVENTION

In spray-painting and lacquering technology, the use of compressed air as carrier medium for the paint to be applied plays a considerable role. In the context of the present invention, compressed air also encompasses air mixtures or pure gases such as, for example, nitrogen which are provided for use in lacquering technology.

The generation of compressed air within desired parameters such as pressure, temperature and volume flow is associated with considerable costs in the lacquering process. For example, high-speed rotary atomizers and lacquering pistols exist which require air volumes of 100 to 800 l/min in order to provide the desired application of lacquer. Regardless of this, in lacquering technology, values higher or lower than these are indeed common, depending on which method is used.

From the prior art, devices are known which effect a treatment of the compressed air by way of ionization chambers, for example, by virtue of air that flows over a comb charged with high voltage being electrically neutralized. It is an aim of such arrangements to optimally utilize the available compressed air and minimize provision volume.

SUMMARY OF THE INVENTION

It is an object of the invention to carry out further treatment of compressed air for lacquering processes in such a way that, in the course of processing, air volume can be saved, whereby a cost saving is achieved. Furthermore, the saving of lacquer and improvement in quality of the coating result can be influenced by way of the compressed-air quality.

The compressed-air treatment chamber according to the present invention for improving the flow characteristics of compressed air or compressed-gas mixtures in the lacquering process comprises the following:
- a housing for forming a cavity, wherein the housing comprises an outer shell which delimits the cavity;
- at least one air inlet opening and at least one air outlet opening, wherein the air inlet opening and the air outlet opening are arranged such that the cavity can be flowed through by the compressed air or by the compressed-gas mixture, preferably can be flowed through in a longitudinal direction;
- at least one electrode arranged within the cavity; and
- at least one high-voltage source for supplying high voltage to the electrode.

According to the present invention, the compressed-air treatment chamber is characterized in that at least one insulation layer is arranged within the cavity on an inner surface of the outer shell, and, an electromagnetic field, preferably an inhomogeneous electromagnetic field or a partially inhomogeneous electromagnetic field, with an active zone for the throughflow of compressed air for treatment, can be generated in the interior of the cavity, between the electrode and a counter electrode.

The flow through the electromagnetic field improves the flow characteristics of the compressed air in the downstream line system to the point of discharge at a lacquering pistol, and the absorption of the paint particles or powder particles to be atomized and transported. Reduced air volume consumption by more than 5% to 20% or greater, and/or an effective material saving of 5% to 20% or greater in terms of the paint to be applied, are achieved if the compressed air has passed through a chamber according to the invention. It is particularly preferably the case that, with suitable selection of the parameters of the electromagnetic field, the air exits the chamber in neutral form, preferably with a negative excess charge, which in particular prevents the transportation of dust. For particular applications, it is also provided that the air exits the chamber with a positive excess charge.

Also provided according to the present invention is a method for the operation of a compressed-air treatment chamber according to the invention. The operation of the chamber is characterized in that a high-voltage field, in particular, a high-voltage alternating field, is applied between electrode and counter electrode, wherein a high voltage of between 800 V and 100 kV, in particular between 2 kV and 20 kV, preferably between 4 kV and 16 kV and particularly preferably 5 kV and 8 kV is applied.

The selection of the high voltage to be applied is dependent on a multiplicity of parameters. Here, it is essential that consideration be given to the breakdown voltage in the air, which must not be exceeded in order to prevent formation of an arc between the electrodes. In this respect, the voltages are significantly dependent on the geometric spacings between the electrodes, and may even exceed the specified values in the case of greatly enlarged chambers.

It is relevant to the present invention that the compressed air passes through as intense a high-voltage field as possible. It may advantageously be the case here that the voltage field generates, at least in the boundary region, a non-thermal plasma which influences the flow characteristics of the compressed air.

In the context of the present invention, a lacquering process is to be understood in particular to mean a process in which, with the aid of compressed air, even substances other than paints and lacquers, specifically in particular lubricants and/or release agents, in particular, are applied. Here, lubricants should in particular be in the form of oils and/or in particular aerosols and/or in particular oil aerosols. Here, an application of lubricants is performed in particular in accordance with minimum-quantity lubrication, or in particular in other suitable applications.

Here, provision is also made for the electrode and the counter electrode to be designed such that the electromagnetic field is formed as a homogeneous field or substantially homogeneous field.

BRIEF DESCRIPTION OF THE DRAWINGS

The present invention itself and the described refinements will be discussed in more detail below on the basis of the example of the description of the figures. Identical constituent parts are in this case denoted by the same reference designations.

DETAILED DESCRIPTION OF THE INVENTION

Figure 1:
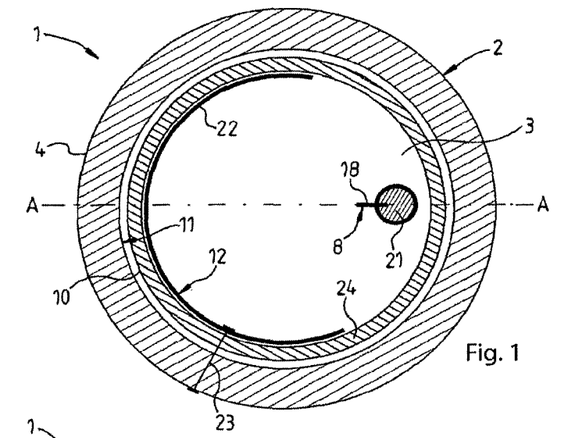
FIG. 1 shows a section through a compressed-air treatment chamber with insulation cylinder and areal electrode along the line B-B.
Figure 2:
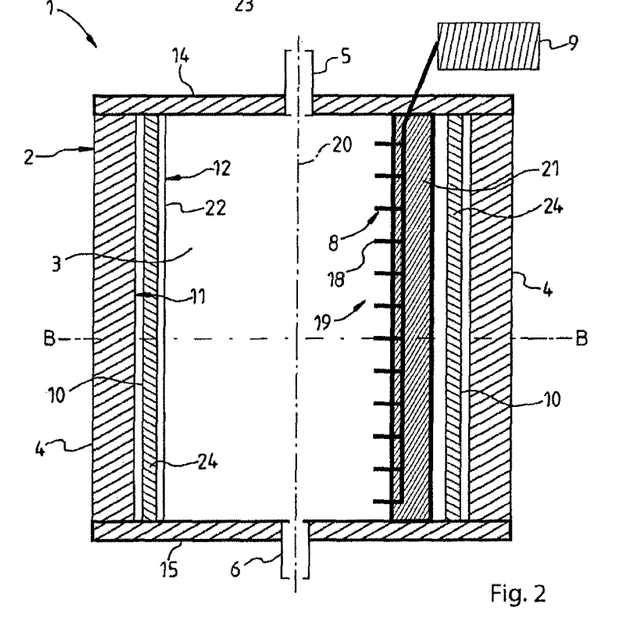
FIG. 2 shows a section through a compressed-air treatment chamber with insulation cylinder and areal electrode along the line A-A.

In detail, FIGS. 1 and 2 show a compressed-air treatment chamber 1. The chamber comprises a housing 2 for forming a cavity 3. The housing 2 furthermore comprises an outer shell 4 which delimits the cavity 3. In the present case, the housing is of cylindrical design, but may also have other geometrical shapes, for example, rectangular outer contours and internal dimensions. The rotationally symmetrical enclosure is however advantageous for flow characteristics.

Figure 3:
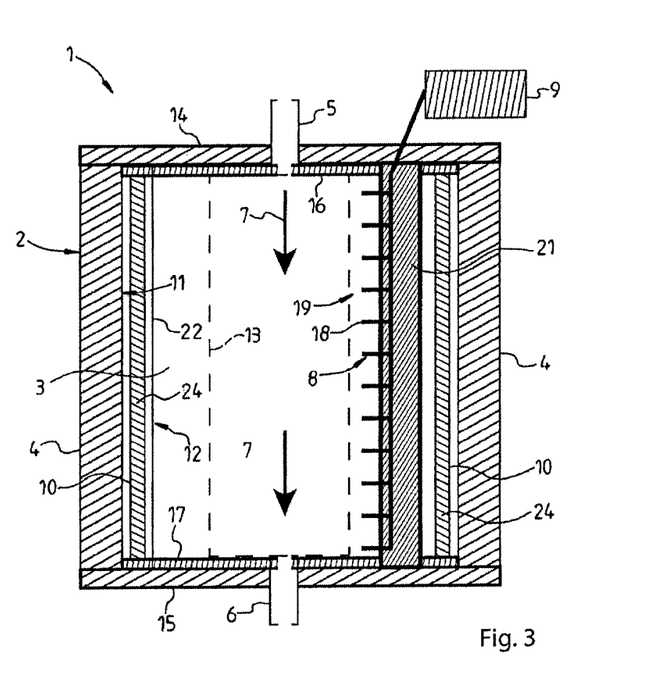
FIG. 3 shows a section corresponding to FIG. 2 with active zone indicated.

Furthermore, the housing 2 comprises an air inlet opening 5 and an air outlet opening 6, wherein the air inlet opening 5 and the air outlet opening 6 are arranged such that the cavity 3 can be flowed through by the compressed air or the compressed-gas mixture along the flow direction 7 (see FIG. 3). In a design variant which is not illustrated, provision is also made for the housing to comprise at least one air inlet opening and, in particular, multiple air inlet openings, and/or at least one and in particular multiple air outlet openings.

An electrode 8, 19 is arranged in the cavity 3. In the present case, the electrode 8 is in the form of a comb-type electrode 19 and has multiple electrode tips 18 arranged one behind the other in the manner of a comb. The electrode tips 18 are embedded in an electrode casing 21 which has no electrically conductive connection to the outer shell 4 or to a ground.

It is also advantageous, in particular, in the case of relatively large chambers, for multiple electrodes to be arranged adjacent to one another in order to provide adequate field coverage for the treatment of the compressed air.

The absence of an electrical connection between the electrode casing 21 and the outer shell 4 of the housing 2 is an unusual arrangement and provides, in the manner according to the present invention, the required electromagnetic field between comb-type electrode 19 and counter electrode 12.

The compressed-air treatment chamber 1 according to the present invention comprises at least one high-voltage source 9 for supplying high voltage to the electrode in accordance with the method.

Within the cavity 3, a counter electrode 12 in the form of an areal electrode 22 is arranged on an inner surface 11 of the outer shell 4, in such a way that, in the interior of the cavity 3, between the electrode 19 and a counter electrode 12, 22, there is generated an inhomogeneous electromagnetic field with an active zone 13 to be flowed through by compressed air for treatment.

The insulation layer is in the present case in the form of a hollow cylinder 24 and covers at least 75% of the inner surface, in the present case the entire inner surface 11 of the outer shell 4.

It is moreover provided that the housing 2 comprises two closure covers 14, 15, wherein, as illustrated in FIG. 3, at least one, preferably both closure covers 14, 15 have an insulation layer 16, 17 on a side facing toward the cavity 3, or an insulation layer is arranged as a separate component between cavity and closure cover.

In the case of the housing being produced as a turned part, at least one closure cover may be formed integrally with the outer shell.

All of the embodiments shown in FIGS. 1 to 7 show that the electrode 8 is positioned asymmetrically with respect to a central axis 20 of the cavity 3. The positioning may be selected virtually freely in a manner adapted to the flow parameters. It has proven to be advantageous for the electrode 8 to be arranged in particular in a ratio of approximately 1/3 to 2/3 between the outer shell 3 and the central axis 20. In the case of relatively large chambers, it is also conceivable for multiple electrodes to be provided within a cavity, which electrodes must then be correspondingly spaced apart from one another. It has also proven to be advantageous for the electrode or electrodes to have a spacing of 1 cm to 20 cm, and in particular 1 cm to 15 cm, and preferably 2 cm to 12 cm, to the counter electrode.

Figure 6:
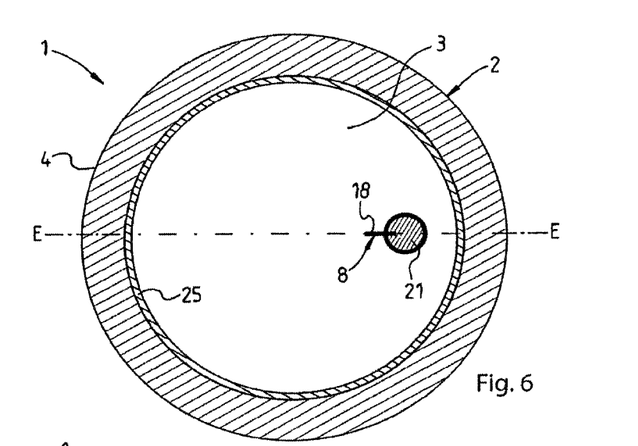
FIG. 6 shows a section through a compressed-air treatment chamber with insulation coating and without areal electrode along the line F-F.
Figure 7:
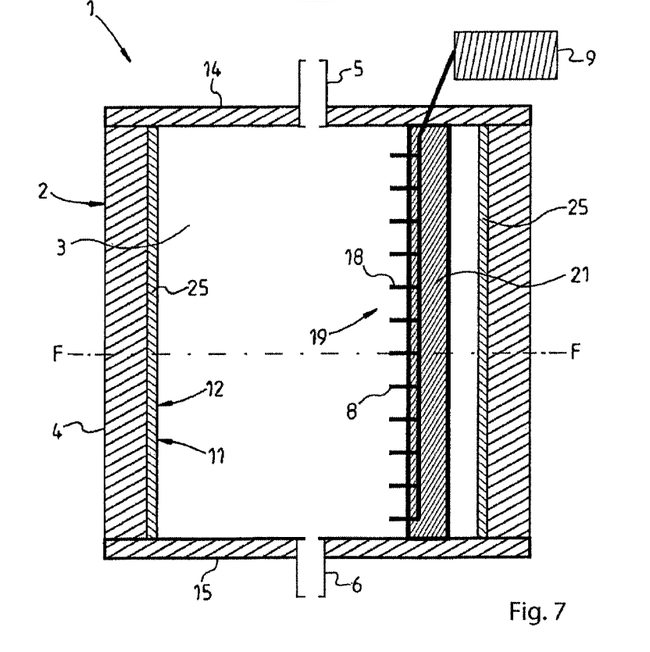
FIG. 7 shows a section through a compressed-air treatment chamber with insulation coating and without areal electrode along the line E-E.

A particular embodiment of the compressed-air treatment chamber 1 is illustrated in FIGS. 6 and 7. Here, the counter electrode 12 is formed by the inner surface 11 of the outer shell 4, with interposition of the insulation layer 25 as dielectric. This particularly simple design of enclosure of the treatment chamber is already satisfactory for a multiplicity of applications.

Figure 4:
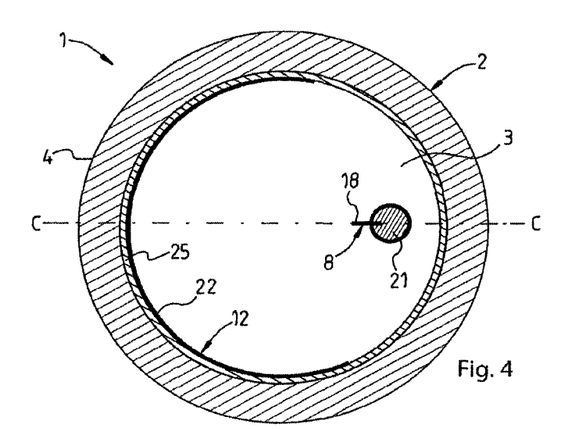
FIG. 4 shows a section through a compressed-air treatment chamber with insulation coating and areal electrode along the line D-D.
Figure 5:
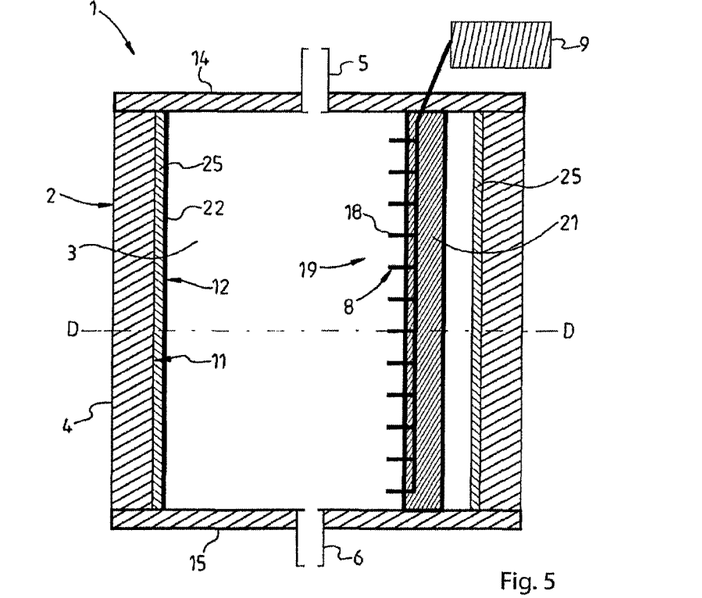
FIG. 5 shows a section through a compressed-air treatment chamber with insulation coating and areal electrode along the line C-C.

An enhancement of the embodiment as per FIGS. 6 and 7 is illustrated in a compressed-air treatment chamber 1 as per FIGS. 4 and 5. Here, the counter electrode 12 is formed by an areal electrode 22 with interposition of the coating insulation layer 25 as dielectric between areal electrode 22 and inner surface 11 of the outer shell 4. The use of an areal electrode 22 composed of electrically conductive material improves the formation of the electromagnetic field for the action, according to the invention, on the compressed air.

For further improvement of the electromagnetic field, it is illustrated by way of example in FIG. 1 that the counter electrode 12 is connected to the outer shell 4, preferably by way of an electrically conductive connection 23 in the form of screw connections, or in similar electrically conductive fashion. It is self-evidently possible for a corresponding connection to be provided in all variants according to FIGS. 1 to 7.

Although not illustrated in any more detail in the figures, it nevertheless falls within the present invention for the areal electrode 22 to be in the form of a metallic grid. A grid likewise provides a good counter electrode for the electromagnetic field, wherein, in particular, the field build-up is intensified by grid effects.

It is however also conceivable for the areal electrode to be in the form of a metallic solid surface.

In the variants in FIGS. 1 to 3, the insulation layer 10 is in the form of a hollow body pushed into the cavity 3, in particular a tube section or hollow cylinder 24. The simple pushing-in of a hollow cylinder 24 constitutes an inexpensive and maintenance-friendly provision of an insulation layer 10.

Alternatively, the insulation layer 10 may also, as illustrated in FIGS. 4 to 7, be in the form of a coating applied to the inner surface 11 of the outer shell 4, in particular in the form of a chemically applied coating or lacquer coating or plastics melt coating or the like. Here, the insulation characteristics can be set and finely adjusted in accordance with the coating thickness. Furthermore, it is possible to manufacture a unipartite product without the need for cylinders or the like to be pushed in manually.

In the compressed-air treatment chamber 1 according to the present invention, the active zone encompasses at least ⅓ of the cavity diameter, preferably between ⅓ and ⅔ of the cavity diameter, in particular ½ of the cavity diameter, in order to prepare an adequate volume flow of compressed air.

The central axis of the cavity corresponds to the flow direction of the compressed air. It is conceivable for the compressed-air treatment chamber 1 to be incorporated as a separate component into the compressed-air flow or to be in the form of a tubular section in the line system. It is essential that flow passes through the electromagnetic field. Static exposure, for example in the form of an expansion tank or the like, does not generate the effect according to the present invention.

Figure 8:
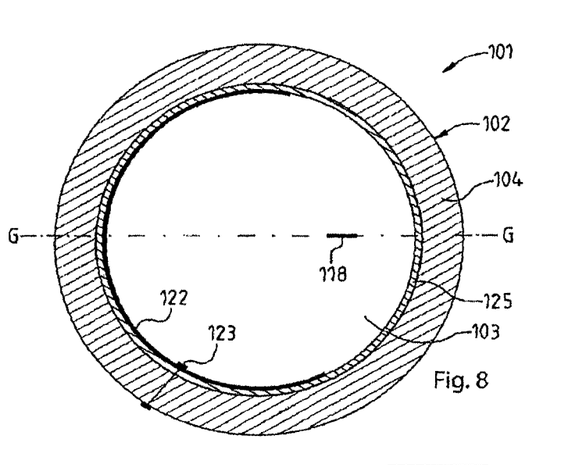
FIG. 8 shows a section through a compressed-air treatment chamber with insulation coating and areal electrode along the line H-H.
Figure 9:
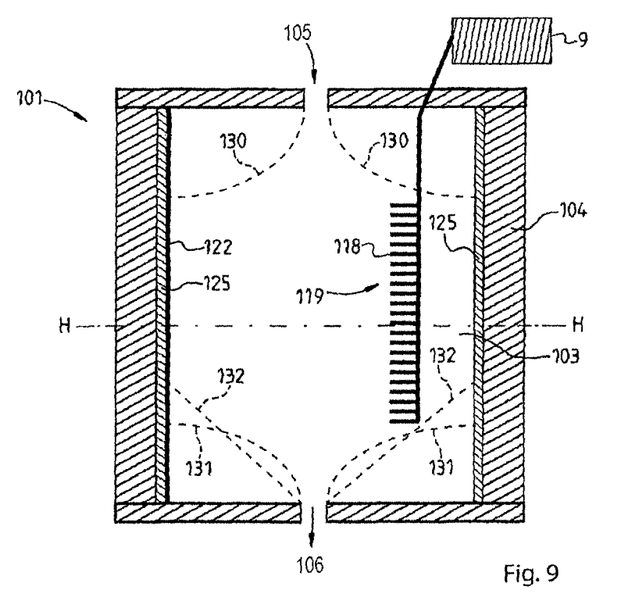
FIG. 9 shows a section through a compressed-air treatment chamber with insulation coating and areal electrode along the line G-G.

FIG. 8 shows a further embodiment of a compressed-air treatment chamber 101 according to the present invention along the section line H-H. FIG. 9 shows a corresponding illustration of the chamber along the section line G-G. The cylindrical housing 102 in this case correspondingly surrounds, by way of its outer shell 104, a cavity 103. Arranged in the interior is an insulation layer 125, on at least part of the surface of which there is provided an areal electrode 122 as counter electrode 112. The areal electrode 122 is connected by way of an electrically conductive connection, for example a screw 123, to the housing 102.

In the interior of the cavity 103, there is arranged, as an electrode 108, a comb-type electrode 119 with a multiplicity of electrode tips 118. Here, the electrode tips 118 have a spacing of between 1 mm and 200 mm and in particular between 1 mm and 50 mm and of preferably 2 mm, and are arranged directly, without an electrode shell, in the interior of the cavity 103.

The close and non-insulated arrangement of the tips improves the inhomogeneous high-voltage field and smooths the field effects at the tips owing to the small spacing.

The compressed-air treatment chamber 101 correspondingly has an air inlet 105 and an air outlet 106, through which an air throughflow is made possible.

By way of example, but without restriction to this embodiment, FIGS. 8 and 9 and 10 and 11 indicate, by way of dashed lines, a flow funnel 130 on the inlet side and a flow funnel 131 on the outlet side. The flow funnels 130 and 131 have a rotationally symmetrical shape and are accommodated in the interior of the cavity 103 in order to improve the, as far as possible, laminar flow characteristics of the compressed air in the interior of the compressed-air treatment chamber 101. In their envelopes, the flow funnels 130 and 131 are of not linear but rather parabolic or hyperbolic form in order to realize a good flow profile. Alternatively, at one side or both sides, for flow reasons or in order to improve manufacturing efficiency (more cheaply producible), it is also possible to utilize a linear funnel shape, as illustrated by way of example by dashed lines on the outlet side as a flow funnel 132.

The embodiment as per FIGS. 8 and 9 comprises a comb-type electrode 119 with a reduced spacing of the electrode tips 118 in relation to FIGS. 1 to 7.

Figure 10:
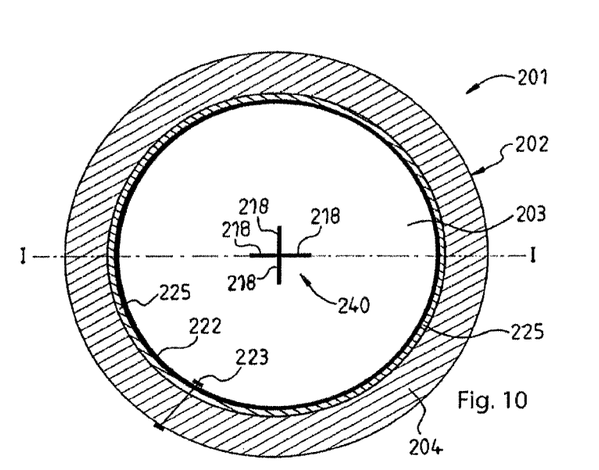
FIG. 10 shows a section through a compressed-air treatment chamber with insulation coating and areal electrode along the line J-J.
Figure 11:
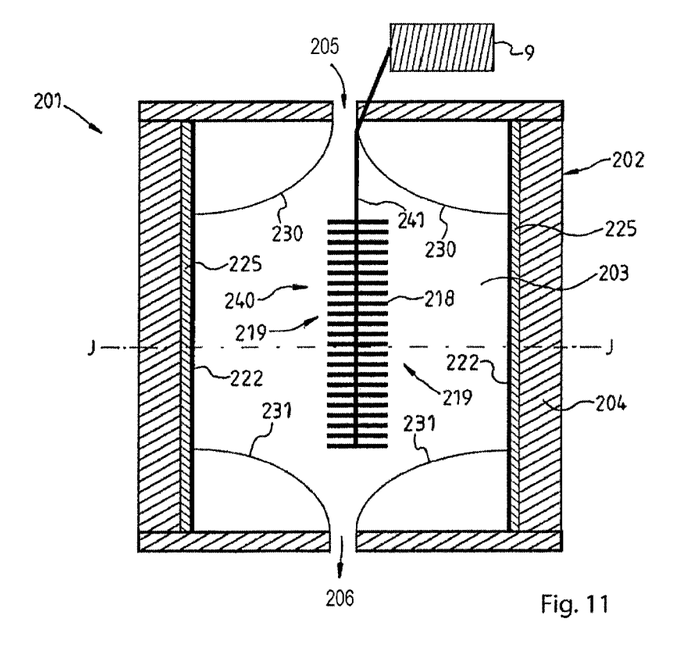
FIG. 11 shows a section through a compressed-air treatment chamber with insulation coating and areal electrode along the line I-I.

FIGS. 10 and 11 show a further preferred embodiment of the compressed-air treatment chamber 201. Here, FIG. 10 is a section along the line J-J, and FIG. 11 is a section along the line I-I.

The compressed-air treatment chamber 201 likewise comprises a housing 202 with a cavity 203. In this embodiment, the cavity is surrounded in encircling fashion by an insulation layer 225, on which an areal electrode 222 as counter electrode 212 is formed in encircling fashion. The areal electrode 222 is connected in electrically conductive fashion to the outer shell 204, and thereby grounded, by way of a contacting means, for example a screw 223. Alternatively, provision is however also made for the counter electrode to be designed as a non-grounded counter electrode, which is accommodated in insulated fashion in the cavity. Here, provision is made for the counter electrode to be formed from lead or copper.

Flow funnels 230 and 231 are provided in the interior. The linear embodiment corresponding to the illustration 132 is also conceivable (see FIG. 9).

The compressed-air treatment chamber 201 comprises a fourfold comb-type electrode 240 which, surrounding a line 241, has electrode combs 219 symmetrically at 90° angular intervals in stellate fashion as an electrode 208. The electrode tips 218 are, correspondingly to the embodiment of FIGS. 8 and 9, formed with a spacing of preferably 2 mm. In other design variants, provision is also made for the comb-type electrode to be in the form of a twofold or threefold comb-type electrode or manifold comb-type electrode.

The fourfold comb-type electrode 240 is preferably arranged approximately to exactly centrally in the interior of the cavity 203, and is flowed around by the compressed air from the inlet opening 205 to the outlet opening 206. In design variants that are not illustrated, the comb-type electrode is in the form of an n-fold comb-type electrode, wherein n is a natural number greater than 1.

Figure 12A:
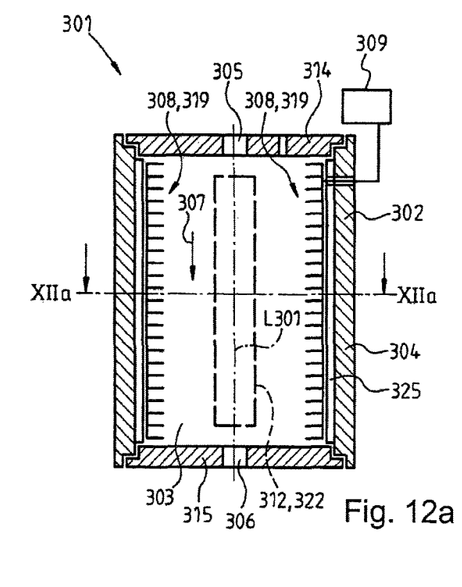
FIG. 12a shows a sectional side view of a compressed-air treatment chamber with central counter electrode and concentrically arranged electrode combs.
Figure 12B:
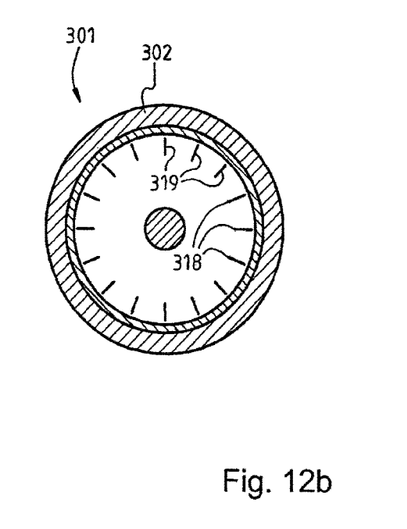
FIG. 12b shows a cross section through FIG. 12a corresponding to the section line XIIa-XIIa.

FIG. 12a shows, in a sectional side view, a further compressed-air treatment chamber 301, which forms a design variant illustrated with respect to the compressed-air treatment chamber illustrated in FIGS. 10 and 11. The compressed-air treatment chamber 301 comprises, as electrode 308, a multiplicity of electrode combs 319 which are arranged in encircling fashion along an insulation layer 325, which lines an outer shell 304 of a housing 302, in a cavity 303. In the housing 302 of the compressed-air treatment chamber 301, a counter electrode 312 runs centrally or symmetrically with respect to a longitudinal central axis L301 of the compressed-air treatment chamber 301, the counter electrode being in the form of a bar-shaped areal electrode 322, in the case of which the shell surface of the bar forms the effective surface. In a design variant that is not illustrated, provision is also made for the counter electrode to be in the form of a grid-type electrode, which is in particular of internally hollow form. As can be seen from the sectional view shown in FIG. 12b, which corresponds to the section line XIIa-XIIa, at least 16 electrode combs 319 are positioned parallel to one another and so as to run in a flow direction 307 and so as to be distributed uniformly on the inner circumference. In other design variants that are not illustrated, provision is however also made for only two or more electrode combs to be positioned so as to run in a flow direction 307 and so as to be uniformly distributed on the inner circumference. The electrode combs 319, with their electrode tips 318, have in each case the same radially measured spacings with respect to the electrode 308. The counter electrode 312 is held at its illustrated position in the housing by a non-conductive holding device (not illustrated), and is thus accommodated in the cavity 303 without being grounded. The electrode combs 319 are all connected to a high-voltage source 309 and are held without making conductive contact with the housing 302. The housing 302 comprises not only the outer shell 304 but also an upper closure cover 314 and a lower closure cover 315. These have an air inlet opening 305 and an air outlet opening 306. In a design variant that is not illustrated, provision is also made for the counter electrode to be grounded.

Figure 13A:
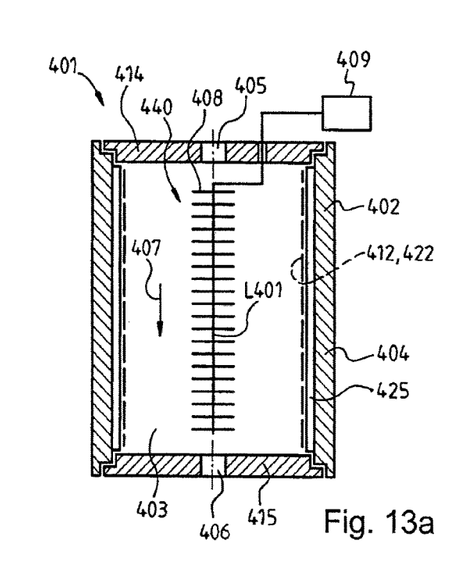
FIG. 13a shows a sectional side view of a compressed-air treatment chamber with cylindrical-shell-shaped counter electrode and centrally arranged electrode combs.
Figure 13B:
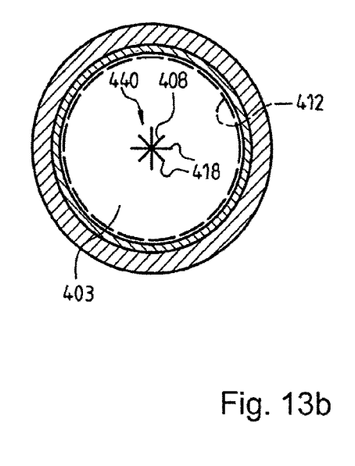
FIG. 13b shows a cross section through FIG. 13a corresponding to the section line XIIIa-XIIIa.

FIG. 13a shows, in a sectional side view, a further compressed-air treatment chamber 401 which forms a further design variant with respect to the compressed-air treatment chamber illustrated in FIGS. 10 and 11. The compressed-air treatment chamber 401 comprises, as an electrode 408, an 8-fold comb-type electrode 440, which is likewise arranged centrally with respect to an outer shell 404 of a housing 402. In other design variants that are not illustrated, provision may however also be made for comb-type electrodes with other numbers of tips to be used. The outer shell 404 is lined with an insulation layer 425. In the housing 402 of the compressed-air treatment chamber 401 there is arranged, in encircling form in the shape of a cylindrical shell and symmetrically with respect to a longitudinal central axis L401 of the compressed-air treatment chamber 401, a counter electrode 412 as areal electrode 422. As can be seen from the sectional view shown in FIG. 13b, which corresponds to the section line XIIIa-XIIIa, the electrode 408 and the counter electrode 412 are arranged centrally and symmetrically in the housing 402. The comb-type electrode 440, with its electrode tips 418, has in each case the same radially measured spacings with respect to the encircling electrode 408. The electrode 408 is held in its illustrated position in the housing 402 by way of a non-conductive holding device (not illustrated), and is thus accommodated in the cavity 403 without a conductive connection. The comb-type electrode 440 is connected to a high-voltage source 409 and is likewise held without making conductive contact with the housing 402. The housing 402 comprises not only the outer shell 404 but also an upper closure cover 414 and a lower closure cover 415. These have an air inlet opening 405 and an air outlet opening 406 arranged such that the cavity 403 can be flowed through by the compressed air or compressed-gas mixture along the flow direction 407.

In design variants that are not illustrated, provision is also made, in the exemplary embodiments shown in FIGS. 1 to 13b, that the outer shell is grounded. Thus, the counter electrode is also indirectly grounded if it is connected to the outer shell by way of a conductive connection. Such design variants are characterized in that the outer shell is grounded and in that the counter electrode is connected by way of a conductive connection to the outer shell. Further design variants duly have a grounded outer shell but not grounded counter electrodes.

Provision is also made for the electrode to extend over at least 60% and in particular more than 90% of a distance between the upper closure cover and the lower closure cover, and for the counter electrode to extend over the entire distance between the upper closure cover and the lower closure cover. In this way, the compressed-air treatment chamber is designed such that compressed air that flows through the cavity of the compressed-air treatment chamber flows through the electromagnetic field over a major part of its path from the air inlet opening to the air outlet opening. Furthermore, it is ensured in this way that the electrode and counter electrode are situated opposite one another, transversely with respect to the flow direction, over the entire longitudinal extent of the electrode, and thus the electromagnetic field that is generated is flowed through optimally by the compressed air.

In the case of the method for the operation of a compressed-air treatment chamber, provision is made for a high-voltage field, in particular a high-voltage alternating field, to be applied between the electrode and the counter electrode, wherein a high voltage of between 800 V and 100 kV, in particular between 2 kV and 20 kV, preferably between 4 kV and 16 kV, and particularly preferably between 5 kV and 8 kV, is applied, wherein, when high voltage is applied, an inhomogeneous electromagnetic field is formed in the cavity of the compressed-air treatment chamber, and the inhomogeneous electromagnetic field is flowed through by compressed air.

The compressed-air treatment chamber is operated in such a way, or is designed with regard to its electrode and its counter electrode in such a way, that a positive charge excess, that is to say an excess of positive charges, is present in its cavity. In one design variant, the compressed-air treatment chamber is operated in such a way, or is designed with regard to its electrode and its counter electrode, in such a way that a negative charge excess, that is to say an excess of negative charges, is present in its cavity. In a further design variant, the compressed-air treatment chamber is operated in such a way, or is designed with regard to its electrode and its counter electrode, such that a neutral charge state is set or maintained in its cavity.

An areal electrode is to be understood, in the broadest sense, as a metallic surface. Here, in alternative embodiments, the surface is in particular also formed by a shell surface of a bar or by shell surfaces of multiple bars.

In the context of the invention, a comb-type electrode is to be understood to mean a number of discharging tips on a carrier, wherein the discharging tips protrude in the form of a comb and are situated with their tip ends in free space. The contacting is realized via the carrier as an electrical conductor, which is normally connected to a voltage source.

In the context of the invention, an insulation layer is to be understood to mean either a plastics layer, fixedly or detachably connected to the housing, a surface coating, in particular an insulation lacquer, or a chemically generated coating, such as in particular an anodized layer.

An inhomogeneous electromagnetic field is to be understood to mean a field with substantially curved field lines.

LIST OF REFERENCE DESIGNATIONS

1 Compressed-air treatment chamber
2 Housing
3 Cavity
4 Outer shell
5 Air inlet opening
6 Air outlet opening
7 Flow direction
8 Electrode
9 High-voltage source
10 Insulation layer
11 Inner surface of the outer shell
12 Counter electrode
13 Active zone
14 Closure cover, top
15 Closure cover, bottom
16 Insulation layer, top
17 Insulation layer, bottom
18 Electrode tip
19 Comb-type electrode
20 Central axis of the cavity
21 Electrode casing
22 Areal electrode
23 Connection, conductive
24 Hollow cylinder
25 Insulation layer as coating
101 Compressed-air treatment chamber
102 Housing
103 Cavity
104 Outer shell
105 Air inlet opening
106 Air outlet opening
108 Electrode
112 Counter electrode
118 Electrode tip
119 Comb-type electrode
122 Areal electrode
123 Connection, conductive
125 Insulation layer
130 Flow funnel, non-linear
131 Flow funnel, non-linear
132 Flow funnel, linear
201 Compressed-air treatment chamber
202 Housing
203 Cavity
204 Outer shell
205 Air inlet opening
206 Air outlet opening
208 Electrode
212 Counter electrode
218 Electrode tip
219 Comb-type electrode
222 Areal electrode
223 Connection, conductive
225 Insulation layer
230 Flow funnel, non-linear
231 Flow funnel, non-linear
240 Fourfold comb-type electrode
241 Line
301 Compressed-air treatment chamber
302 Housing
303 Cavity
304 Outer shell
305 Air inlet opening
306 Air outlet opening
307 Flow direction
308 Electrode
309 High-voltage source
312 Counter electrode
314 Closure cover, top
315 Closure cover, bottom
18 Electrode tip
319 Comb-type electrode
322 Areal electrode
325 Insulation layer
L301 Longitudinal central axis
401 Compressed-air treatment chamber
402 Housing
403 Cavity
404 Outer shell
405 Air inlet opening
406 Air outlet opening
407 Flow direction
408 Electrode
409 High-voltage source
412 Counter electrode
414 Closure cover, top
415 Closure cover, bottom
418 Electrode tip
422 Areal electrode
425 Insulation layer
440 Manifold comb-type electrode
L401 Longitudinal central axis

The invention claimed is:

1. A compressed-air treatment chamber for improving the flow characteristics of compressed air or compressed-gas mixtures in a lacquering process, comprising:
   a housing having a cavity, wherein the housing comprises an outer shell which delimits the cavity;
   at least one air inlet opening and at least one air outlet opening, wherein the air inlet opening and the air outlet opening are arranged such that the cavity is flowed through by the compressed air or by the compressed-gas mixture, which is flowed through in a longitudinal direction;
   at least one electrode arranged within the cavity;
   at least one high-voltage source for supplying high voltage to the electrode;
   at least one insulation layer arranged within the cavity on an inner surface of the outer shell; and
   a counter electrode formed by the inner surface of the outer shell with interposition of the insulation layer as a dielectric, wherein
   an electromagnetic field, with an active zone for the throughflow of compressed air for treatment, is generated in the interior of the cavity between the electrode and the counter electrode.

2. The compressed-air treatment chamber as claimed in claim 1, wherein the insulation layer covers at least 75% of the inner surface of the outer shell.

3. The compressed-air treatment chamber as claimed in claim 1, wherein the housing further comprises two closure covers, wherein at least one of the closure covers has one of an insulation layer on a side facing toward the cavity, or an insulation layer that is arranged between the cavity and the closure cover, wherein the insulation layer is formed in the interior of the cavity in order to promote a laminar airflow.

4. The compressed-air treatment chamber as claimed in claim 1, wherein the at least one electrode is one of a tipped electrode, or a comb-type electrode with multiple tips.

5. The compressed-air chamber as claimed in claim 1, wherein the electromagnetic field is an inhomogeneous electromagnetic field proceeding from a multiplicity of electrode tips having a tipped spacing of 1 mm to 200 mm.

6. The compressed-air treatment chamber as claimed in claim 1, wherein the at least one electrode is positioned asymmetrically with respect to a central axis of the cavity, in one of a ratio of 1/3 to 2/3 between the outer shell and the central axis, or in that the at least one electrode and the counter electrode are arranged with spacings of 0.5 cm to 20 cm to one another.

7. The compressed-air treatment chamber as claimed in claim 1, wherein the at least one electrode is positioned in stellate fashion in the region of the center of the cavity symmetrically with respect to a central axis of the cavity.

8. The compressed-air treatment chamber as claimed in claim 1, wherein the at least one electrode comprises an electrode shell, wherein the electrode shell has one of no electrically conductive connection, or an electrically conductive connection, with respect to the outer shell or a ground.

9. The compressed-air treatment chamber as claimed in claim 1, wherein the at least one electrode is formed so as to be exposed, without an electrode shell or an insulation layer.

10. The compressed-air treatment chamber as claimed in claim 1, wherein the counter electrode is formed by an areal electrode with the interposition of the insulation layer as the dielectric between the areal electrode and the inner surface of the outer shell.

11. The compressed-air treatment chamber as claimed in claim 10, wherein the areal electrode is connected in an electrically conductive fashion to the outer shell.

12. The compressed-air treatment chamber as claimed in claim 1, wherein the insulation layer is one of a hollow body inserted into the cavity, or a coating applied to the inner surface of the outer shell, with the coating being one of a chemically applied coating, a lacquer coating or a plastics melt coating.

13. The compressed-air treatment chamber as claimed in claim 1, wherein the active zone encompasses at least 1/3 of a cavity diameter.

14. A method for operating the compressed-air treatment chamber as claimed in claim 1, wherein a high-voltage field, which is a high-voltage alternating field, is applied between the electrode and the counter electrode, wherein a high voltage of between 800 V and 100 kV is applied.

15. The compressed-air treatment chamber as claimed in claim 1, wherein the electromagnetic field is one of an inhomogeneous electromagnetic field or a partially inhomogeneous electromagnetic field.

16. The compressed-air treatment chamber as claimed in claim 2, wherein the insulation layer covers the entire surface.

17. The compressed-air treatment chamber as claimed in claim 11, wherein the areal electrode is formed as one of a metallic grid or a metallic solid surface.

18. The compressed-air treatment chamber as claimed in claim 12, wherein the hollow body is one of a tubular section or a hollow cylinder.

* * * * *